United States Patent
Widdup

(10) Patent No.: US 7,500,167 B2
(45) Date of Patent: Mar. 3, 2009

(54) BER CALCULATION DEVICE FOR CALCULATING THE BER DURING THE DECODING OF AN INPUT SIGNAL

(75) Inventor: Benjamin John Widdup, Marsfield (AU)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 389 days.

(21) Appl. No.: 10/259,303

(22) Filed: Sep. 30, 2002

(65) Prior Publication Data

US 2004/0064778 A1     Apr. 1, 2004

(51) Int. Cl.
*H03M 13/00*     (2006.01)

(52) U.S. Cl. .................. 714/752; 714/704; 714/755; 714/786

(58) Field of Classification Search .......... 714/755, 714/752, 786, 789, 788
See application file for complete search history.

(56) References Cited

U.S. PATENT DOCUMENTS 5,600,664 A * 2/1997 Hayashi ................. 714/794

2002/0049952 A1 * 4/2002 Lee et al. ................. 714/786

OTHER PUBLICATIONS

Schurgers et al. "Adaptive turbo decoding for indoor wireless communication; 1998 URSI International Symposium on Signals, Systems, and Electronics, ISSSE 98, pp. 107-111; Oct. 2, 1998."*

* cited by examiner

*Primary Examiner*—Guy J Lamarre

(57) ABSTRACT

In a decoder, the BER is calculated during a decode operation of the decoder. Access to decoder components for obtaining signal data for use in calculating the BER is provided during the decode operation when the components are not used by the decoder. A fetch component serves to provide the input signal to both the decoder and BER calculator at the same time. The BER calculator calculates the BER based on the output from the previous iteration. Since the decoder keep decoding the data until the final two iterations result in the same output, the calculation of the BER can be performed during the last iteration of the decoding process. An HDA early termination signal is used to confirm an accurate BER calculation.

12 Claims, 2 Drawing Sheets

BER CALCULATION DEVICE FOR CALCULATING THE BER DURING THE DECODING OF AN INPUT SIGNAL

FIELD OF THE INVENTION

The present invention relates generally to decoders.

BACKGROUND OF THE INVENTOIN

The $3^{rd}$ Generation Partnership Project (3GPP) standard for the Universal Mobile Telecommunication System (UMTS) sets forth requirements for broadband packet-based transmission of different forms of data, including text, digitized voice, video and multimedia data at high transmission rates (i.e., up to 2 megabits per second (Mbps)). 3GPP UMTS allows for operating online media applications via mobile computers and/or conventional voice communication via wireless telephones from remote locations.

Specifically, 3GPP UMTS requires the calculation of a transport channel Bit Error Rate (BER) for turbo encoded data using this standard. The BER is calculated on the pre-decoded bits of a code block, excluding any punctured bits, which are removed in order to transmit more data using less bandwidth. Known systems for calculating the transport channel BER require additional processing after the time-consuming decode operation has been completed in order to provide the necessary calculations. With the high speed processing requirements of turbo decoders, and in particular at the maximum data rate of 2 Mbps, it is critical to calculate the transport channel BER at a data rate that minimizes processor time to reduce latency and thereby improve the efficiency of the communicating device. Minimizing processing time eases design constraints and also reduces power usage.

In order to compute the transport channel BER, the output of a decoder must be re-encoded and compared with the input data, excluding the punctured bits (i.e., bits removed before transmission). A major difficulty with this process is that turbo encoders for re-encoding must process data in both interleaved space and in linear space. This makes it impossible to stream the output of the decoder into the re-encoder, because two data streams are required. The need for two data streams results in a re-encoding process, that at best, could provide one half of the re-encode process in streaming mode and the other half after the decoder has finished its decoding operation. Such an approach may reduce the latency of the BER calculation. However, the output is generated in reverse order in interleaved space, which renders the above solution very difficult to implement. For example, it would be possible to use a stack to correct the reversed output, but the control of such a stack becomes very complicated due to a partially filled last window, thereby making this approach virtually impractical. Further, using a stack still does not solve the problem of fetching the decode results in linear order.

Further, in order to calculate the BER, data from different components within a turbo decoder are needed (e.g., for comparison), but are not always available for access. In particular, two sets of data are required, i.e., the input samples and the hard decision decode output, for calculating the BER. The memory buffers that contain this information have a single read port and shared access to this resource is necessary. It is very difficult to use spare processor bandwidth of the turbo decoder on a cycle by cycle basis to obtain input data for the BER calculation process. It is much easier to perform such calculations when other processes are idle. Also, because transport channel BER calculation requires the decode output twice (i.e., once in linear space and once in interleaved space), two passes of the output buffer are required to obtain the data from a single read port memory.

SUMMARY OF THE INVENTION

A decoder of the present invention, and more particularly a turbo decoder having a BER calculation component, computes the BER of the input signal during the decoding of the input signal by the decoder. The decoder uses an early termination signal to provide zero latency BER calculation. The BER can be calculated during the last iteration of the decode process, but based on the results of the second to last iteration using the early termination signal, with the decode results of the last two iterations equal with a successful HDA early termination.

In one embodiment of the present invention a decoder includes a decoding device for decoding an input signal and a data error calculator configured for calculating a data error of the input signal during the decoding of the input signal by the decoder. The decoding device may be configured to determine that an iterative process of the decoding device for providing the decoding is complete based on an nth iteration. Further, the data error calculator calculates the data error based on an nth−1 iteration, such that the calculation of the data error is simultaneous with the decoding of the input signal. The decoding device is also preferably configured to determine that the iterative process is complete based on the nth and nth−1 iterations. More particularly, the decoding device includes an input buffer for receiving the input signal, a fetch component for obtaining the input signal from the input buffer, a decoder core for receiving the input signal from the fetch component and decoding the input signal, and an output buffer for receiving the decoded input signal. The fetch component is configured to provide the input signal to the decoder device and the data error calculator at the same time.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
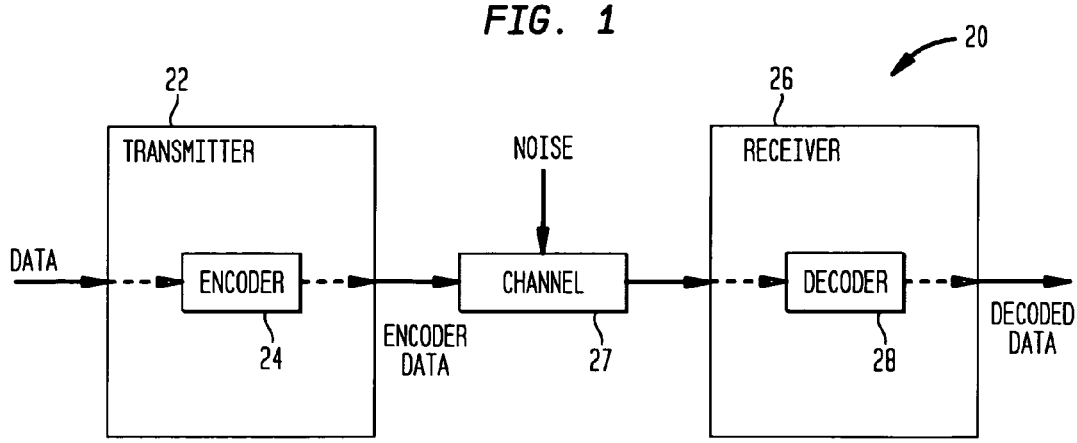
FIG. 1 is a block diagram showing communication of encoded data.

The following description of the preferred embodiments is merely exemplary in nature and is in no way intended to limit the invention, its application, or uses. Although the present invention is described in connection with a particular turbo decoder have specific component parts, it is not so limited, and the present invention may be implemented in different decoders with different component parts.

A structural description of a turbo decoder implementing a transport channel BER calculating process according to the principles of the present invention will first be described followed by an operational description. However, before providing a detailed structural description of the invention and its operation, a general description of BER calculation within the 3GPP UMTS standard and communication system employing a turbo decoder will be provided.

BER Calculation

To begin, the transport channel BER calculation required by the 3GPP UMTS standard is an estimation of the average BER of the DPDCH data of a Radio Link Set. The transport channel BER is measured from the data considering only non-punctured bits at the input of the channel decoder. Thus, the ratio of received bits in error to received bits is required. This calculation is based entirely on hard decision bits even though a soft input soft output (SISO) decoder is used. It should be noted as used herein, a soft decision refers to a decision value plus a confidence value (i.e., potential for error in data) that are equivalent to the transmitted signal plus interference (e.g., noise). The confidence value preferably ranges from −1 to 1, with 1 representing high confidence that the data value is 1, −1 representing high confidence that the data value is −1, and 0 representing no confidence in the data value. Further, the confidence value may be anywhere within the range (e.g., 0.5 representing some confidence that the data value is a 1). Additionally, as used herein, a hard decision refers to a binary estimate of either a received or decoded value without any confidence information.

With respect to calculating the BER, if the hard decision set is defined as $\{-1, 0, 1\}$, −1 represents a received 0, +1 represents a received 1 and 0 is a replaced punctured bit. Further, if $I$ is the set of received hard bits after punctured bit replacement and $O$ is the set of hard decision outputs of the decoder after re-encoding, $N$ is the number of transmitted bits, then $O \in \{-1, 1\}^N$ and the transport channel BER is calculated as follows:

Transport Channel BER=1−(Number of matches between $I$ and $O$/Number of non punctured elements in $I$)

Punctured bits are typically identified by a special soft bit value, which is usually zero. Further, the special soft bit value does not correspond to, for example, an equalizer output, such as a rake receiver output.

It should be noted that in cases where the decoder does not converge (i.e., its output probably does not match the original bit stream), it is impossible to generate the original transmitted sequence as a single bit error inserted into a recursive encoder and will corrupt the remainder of the encode operation. This causes complete corruption of the output and the transport channel BER result is invalid and cannot be used.

Communication System Employing a Turbo Decoder

In general, and as illustrated in FIG. 1, a system 20 for communicating data in a wireless environment generally includes a transmitter 22 having an encoder 24, to transmit encoded data, and a receiver 26, having a decoder 28, for decoding the encoded data. The transmitter 22 receives data to be transmitted and encodes that data using an encoder 24 to make data transmission more efficient (e.g., adding redundancies to correct for signal errors, such as noise caused from a channel 27). The receiver 26 receives the encoded data from the transmitter 22 and uses a decoder 28 to decode the encoded data (e.g., to correct errors and remove the redundancies) and obtain the original data received by the transmitter 22.

With respect to decoding data, one type of decoder 28 for use in wireless communications is a turbo decoder. The turbo decoder is a soft-input, soft-output decoder that decodes data from a turbo encoder. The turbo encoder maps input data into patterns that include redundancies for use in error calculation and correction by the turbo decoder. The turbo decoder performs an iterative process to decode data blocks and determines an error estimate value after each iteration. Thus, a feedback loop is used to improve the data error until a threshold is met, which is usually either when the data has been fully decoded or the data does not converge and is considered impossible to decode as corrupt (e.g., too much interference in the data signal to reliably decode). In a typical system, the BER is calculated after the decode process is complete.

Structural Description

Figure 2:
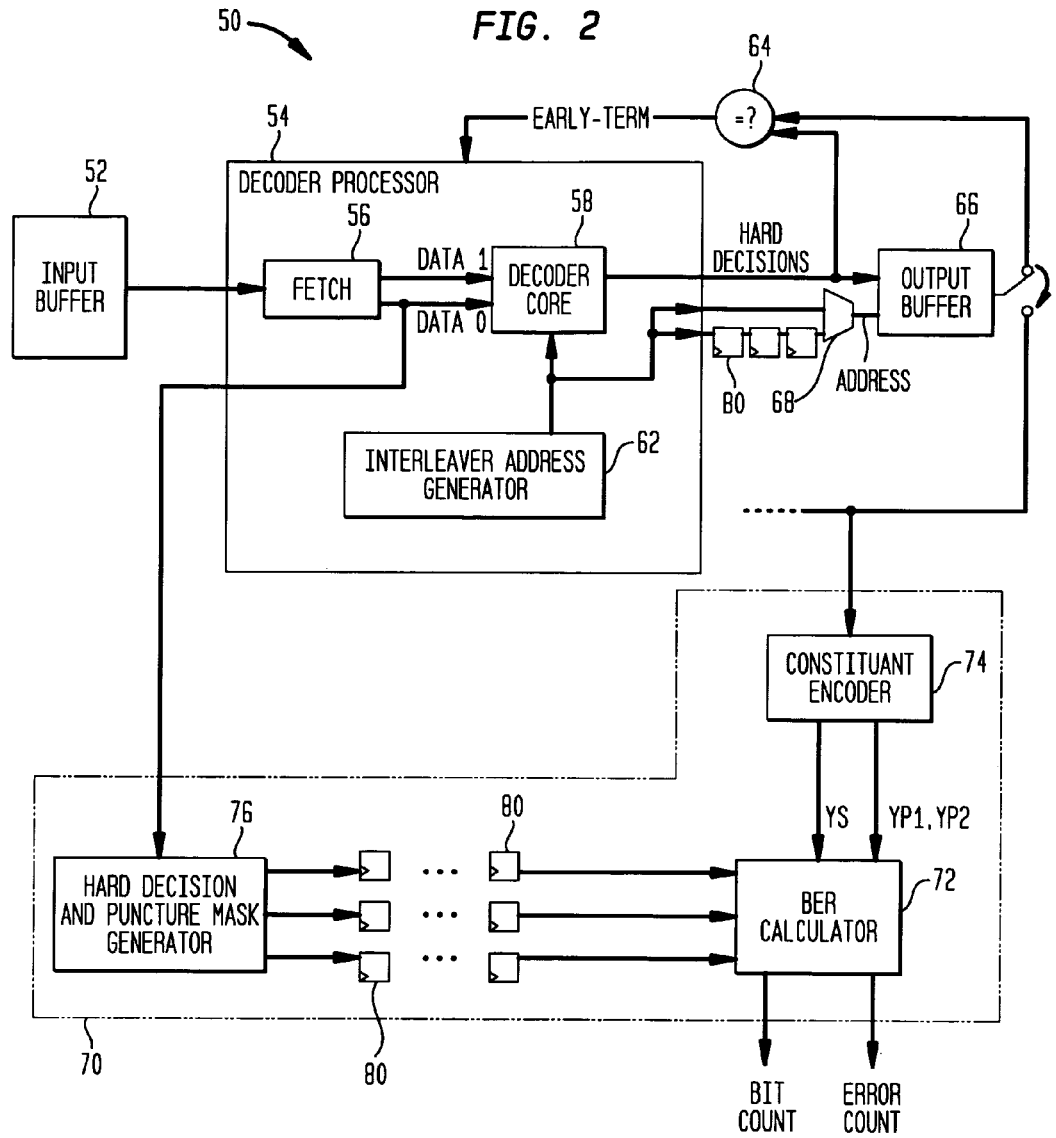
FIG. 2 is a schematic block diagram of a turbo decoder implementing a BER calculation process of the present invention.

FIG. 2 generally illustrates a decoder 50 of the present invention, and specifically a turbo decoder in which control processes for providing BER calculations according to the present invention are implemented. The decoder 50 includes an input buffer 52 for receiving encoded data (i.e., encoded data packets). The input buffer 52 is connected to a decoder processer 54 (e.g., a decoding device having a decoder core) for decoding the received encoded data. Specifically, a fetch component 56 receives encoded data from the input buffer 52 and transmits the encoded data to a decoder core 58 (e.g., core processing unit). The encoded data is provided to the decoder core 58 in a required order and at a specific required time. The decoder core 58 processes (i.e., decodes) the encoded data using an iterative decoding process as is known. Specifically, soft bits for use in a forward calculation of the decoder core 58 are provide by a data0 bus, and the same soft bits time delayed for use in a backward calculation of the decoder core 58 are provided by the data1 bus.

An interleaver address generator 62 is connected to the decoder core 58, which generates address information to control operation of the decoder core 58 and provides address information for an output buffer 66 connected to the decoder core 58 during the decode operation in interleaved space as described herein. A comparator 64 is connected to the output of the decoder core 58 to determine when to stop the iterative decoding process (i.e., last two decode iterations have same result). The output of the comparator 64 is fed back into the decoder core 54, which generates a termination signal, and more particularly an early termination signal, to terminate the decode process when the last two decode operation iterations are the same.

The output buffer 66 that is connected to the decoder core 58 receives decoded data (e.g., hard decisions) from the decoder core 58 every iteration. The interleaver address generator 62 is also connected to the output buffer 66 through a selector 68 to provide address information to the output buffer 66 during the hard decision generation phase of decoding. A delayed version of the address information is selected during the re-encode phase of operation and that is needed to calculate the BER as described herein. The output buffer 66 is connected to a comparator 64, which receives the decoded data for comparison with the output of the decoder core 58. The output of the decoder core 58 is the result from the immediately preceding decode operation iteration (i.e., previous hard decision).

The output of the output buffer 66 is provided to a re-encoder component 70 for re-encoding the decoded data to determine a BER. Specifically, the output of the output buffer 66 is connected to a constituent encoder 74. A BER calculation component 72 (e.g., data error calculator) is connected to the constituent encoder 74 and receives the output of the constituent encoder 74 for use in calculating the BER. The BER calculation component 72 outputs the bit count, representing the number of transmitted bits after puncture, and the error count, representing the number of bits in error, for use in determining the BER (i.e., error count divided by bit count).

A hard decision and puncture mask generator 76 of the re-encoder component 70 receives encoded data from the input buffer 52, determines bits missing (i.e., punctured bits)

from the input signal (i.e., bits removed before transmission to use less bandwidth) and removes those bits from the encoded data to provide a punctured signal (i.e., actual encoded signal received). The hard decision and puncture mask generator 76 removes the confidence component from the input data, thus converting the soft-input into a hard-input. The hard decision and puncture mask generator 76 then outputs bits representing this punctured signal to the BER calculation component 72. The hard decision and puncture mask generator also splits the encoded data from the input buffer into bits representing the originally transmitted signal (i.e., $Y_s$) and parity bits representing data transmission redundancies (i.e., $Y_{p1}$ and $Y_{p2}$). The hard decision and puncture mask generator 76 then outputs these bits (i.e., $Y_s$, $Y_{p1}$ and $Y_{p2}$) to the BER calculation component 72 along with the bits representing the punctured signal. It should be noted that the hard decision and puncture mask generator 76 receives input data from the data0 bus output of the fetch component 56.

Pipeline delays 80 are provided to synchronize the operation of the BER calculations with the decode operation. In particular, a plurality of pipeline delays 80 are provided at each of the outputs of the hard decision and puncture mask generator 76 between the hard decision and puncture mask generator 76 and the BER calculation component 72. A plurality of pipeline delays 80 are also provided at the output of the interleaver address generator 62 between the interleaver address generator 62 and the output buffer 66. It should be noted that the number of pipeline delays 80 provided at each of the outputs equals the number of pipeline stages within the decoder processor 54, which in this case is five. However, the number of pipeline delays 80 may be modified depending upon the timing requirements of the decoder.

Operational Description

In operation, the decoder 50 decodes input data and use a re-encoder component 70 having a BER calculation component 72 to determine the BER. Generally, the decoder component 54 receives input data bits (i.e., soft bits) in the fetch component 56. During the decoding process as is known, the decoder core 58 uses the input soft decisions. The decoder core 58 decodes the input and generates extrinsic data that is stored internally (and used during the next iteration). The decoder core 58 also generates hard decisions, which are stored in the output buffer 66. The decode process will terminate based upon a comparison of the bits in the output buffer 66 with the new hard decisions that are about to be written into the output buffer 66. If the new set of hard decisions is equal to the previous set of hard decisions, the comparator 64 determines that decoding has been successfully completed (i.e., no more iterations are required) and instructs the decoder core 58 to stop decoding.

Further, the hard decision in the output buffer 66 is provided to the constituent encoder 74, resulting in the originally transmitted signal being output from the constituent encoder 74. The re-encoded bits are compared to the received bits (i.e., transmitted signal plus noise represented by the soft decisions) provided from the hard decision and puncture mask generator 76 to calculate a BER as described in more detail below.

During the decode operation, the decoder 50 requires two passes through the decoder core 58 per iteration, once in linear space and thereafter in interleaved space to decode data received from the fetch component 56. The interleaver address generator 62 provides control of the decoder core 58 (i.e., provides data addresses) during decode operation in the interleaved space. It should be noted that the interleaver address generator 62 also generates linear addresses during linear space processing. These passes or half-iterations are hereinafter referred to as dec1 and dec2, respectively. Within each half-iteration, dec1 and dec2, the decoder core 58 processes a data block (i.e., part of the data packet received) in windows (e.g., 40 clock cycles per window), with two passes across each window (i.e., forward and backward) required. These two passes across each window are hereinafter referred to as alpha and beta processing, respectively. The fetch component 56 outputs soft bits using buses data0 and data1 to provide the decoder core 58 with soft bits for processing, and more particularly, eighty bits for each of the alpha and beta processing. It should be noted that during alpha processing and preparation for beta processing (sometimes referred to as dummy beta processing) are performed in a known manner. During beta processing, backward trellis computations and log likelihood calculations are performed in a known manner.

During the decode operation, a hard decision output is generated only in dec 2, and further, only during beta processing. It should be noted that the read port of the output buffer 66 is occupied for Hard Decision Assist (HDA) early termination during this time (i.e., when a hard decision output is generated). Thus, the output buffer 66 is available for BER computation during all of dec1 and during the alpha phase of dec2. The alpha ($\alpha$) and beta ($\beta$) references in FIG. 3 identify when the various buses (i.e. connections between component parts of the decoder 50) are active.

Hard Decision Assist (HDA) early termination is a power reduction feature that may be used in a decoder 50, and more particularly, a turbo decoder, whereby the decoder 50 examines the hard decision output of the decoder component 54 each iteration and compares that result with the previous iteration. If two consecutive iterations have identical hard decision results, the decoder 50 stops the decode operation because the decode operation has converged. If the decoder 50 does not converge by some set number of iterations, usually 8-10, the decoder 50 stops the decode operation because convergence is highly unlikely, and indicates this condition by setting a flag. With HDA early termination, the decode bits of the last two iterations of the decode operation are identical. It should be noted that other types of termination processes or mechanisms may be used to terminate the decode process of the decoder component 54 such as soft decision assist.

Referring again to the decode operation, alpha processing is always a forward operation, which is required for the re-encoding process, because the encoding process in the original encoder is a forward process, and the read port of the output buffer 66 is available during this processing period. The systematic bit and first parity bit (i.e., $Y_S$ and $Y_{p1}$) are compared by the BER calculation component 72 during the alpha phase of the dec1 half-iteration, and the second parity bit (i.e., $Y_{p2}$) is compared during the alpha phase of dec2. The comparison process is not performed during beta processing. Thus, the bit comparison is made before the corresponding bit is written into the output buffer 66, which occurs in the beta phase.

In order to provide this comparison process, the input bit hard decisions are needed at the same time as the output buffer 66 is read. However, the input buffer 52 is occupied by the data fetch component 56 during the decode operation and cannot be used. But, the decoder core 58 uses the input samples (in forward order) during the alpha phase of its processing. Thus, the input bits are tapped off of the input bits from this bus (i.e., data0 bus) during this alpha processing when the fetch component 56 outputs to the decoder core 58. Further, the input bits are transmitted to the hard decision and puncture mask generator 76. Pipeline delays 80 as described herein are used to match the number of pipeline stages within the decoder core 58 to ensure the hard decision and puncture mask bits arrive in the proper clock cycle for the BER calculation component 72. Additionally, the read address of the output buffer 66 for use in BER calculation is already available in the decoder core 58 from the interleaver address generator 62, and a delayed version is used to address the output buffer 66 during alpha processing. It should be noted that the decoder core 58 needs access to the output buffer 66 during beta processing in order to provide early termination.

During the decode process, at the end of each full iteration, a decision is made whether to terminate the decode process. If more iterations are required, the BER calculation component 72 preferably discards (i.e., erases) the previous result and begins the calculation process again. In order to reduce power consumption, no BER calculation is made during the first iteration.

Because the transport channel BER is calculated during the last iteration based on the results of the second last iteration, the results are available before the decode process has been completed. Verification of a correct BER calculation is provided during an HDA early termination because the requirement for early termination is to have two consecutive iterations with the same result.

If early termination is not successful, the decoder 50 has been unable to converge on a stable result and as a consequence there is a high probability that there are errors in the result. In such cases, where there are errors in the decode result, it is impossible to reproduce, or even approximate, the transmitted sequence, because turbo coders use recursive constituent codes. Thus, the BER estimate is valid only when early termination is successful and is indicated by an early termination signal.

With respect specifically to calculating the transport channel BER, for each soft bit, which include the systematic bits representing originally transmitted data (i.e., $Y_s$) and the parity bits (i.e., $Y_{p1}$ and $Y_{p2}$), the BER calculation component 72 determines whether the soft bit is a punctured bit by comparing it with the puncture bit replacement value. Next, the BER calculation component 72 determines a hard decision based on the soft bit by examining its sign. The conversion from a soft decision to hard decision is provided by discarding the confidence information in the soft bit. The hard decision on the soft bit is compared with a corresponding bit from the constituent encoder 74 (i.e., corresponding bit calculated by re-encoding the output of the decoder component 54). If a current bit is a puncture bit, no comparison is made, otherwise the bit count is incremented and, if the hard decision does not match, the error count is also incremented. No incrementing occurs if the bit is a puncture bit (i.e., bit was removed before being transmitted). The comparison/counting steps occur in the BER calculation component 72.

The decoder 50 of the present invention uses this HDA early termination signal to provide zero latency transport channel BER calculation. In particular, using HDA early termination wherein that the last two iterations of a decode operation are identical, the transport channel BER can be calculated during the last iteration, but based on the results of the second to last iteration, thus providing zero latency BER calculation with respect to the decoding operation. Further, the calculation is correct because having identical decode results in two consecutive iterations is the requirement for early termination. However, if the decoder 50 includes HDA functionality, but early termination is not used by the decoder 50, the BER is computed based on the results of the second to last iteration, and an early termination signal is generated when identical decode results are present in two consecutive iterations to validate the BER estimate. It should be noted that it is not possible to determine in advance which iteration is the second to last, and therefore, it is necessary to compute the BER estimate every iteration. The decoder 50 uses pipeline delays 80 as described herein to ensure that there are no resource conflicts on the read ports of any of the buffers.

Figure 3A:
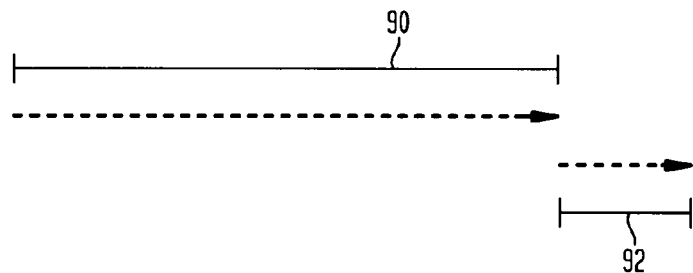
FIGS. 3(a) and 3(b) are time lines illustrating the time reduction for calculating a BER according to the present invention.
Figure 3B:
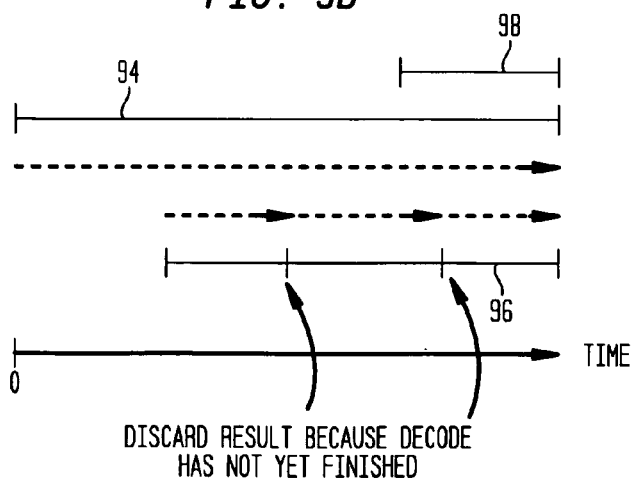

Thus, a transport channel BER calculation process of the present invention for use with a decoder (e.g., turbo decoder) results in zero additional latency compared with the turbo decoding operation. A BER calculation component processes input data based upon the turbo decoder condition that the decoded bits of the $(n-1)^{th}$ iteration is identical to the $n^{th}$ iteration when the HDA early termination is used. Further, tight integration with the decoder processor as described herein minimizes the required logic and power for calculating the transport channel BER. Specifically, the present invention provides a decoder 50 that calculates a transport channel BER in parallel with a decode operation, thereby resulting in zero additional latency after the decode operation as shown in FIGS. 3(a) and 3(b) and high speed operation for the decoder 50. Typically, a decode operation is performed during time period 90 and the re-encode operation needed for BER calculation is performed after the termination of the decode operation time period 90 at time period 92. In the decoder 50, a decode operation is performed during the time period 94 (same as the time period 90) and re-encode operation needed for BER calculation is performed during time period 96, which occurs during time period 94. As shown by the dashed line during time period 96, a space between each of the dashes represents that access to the output buffer 66 for obtaining hard decisions and performing the re-encode operation is available only during alpha processing and is equivalent to 50% of the decode operation during the time period 98 (i.e., active for 40 clock cycles and then a pause for 40 clock cycles).

Simultaneous or parallel calculation of BER and decoding of data is thereby provided by the decoder 50. Essentially, the decoder 50 provides the BER calculation during a decoding operation that uses HDA early termination (i.e., contents of the output buffer 66 being the same during the last two iterations of any decode with a successful HDA early termination). The result is zero latency because the BER result is available up to 40 cycles (i.e., maximum duration of a processing phase) before the decode operation is complete.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A decoder comprising:
    an input buffer configured to receive a first input signal;
    a decoding device for decoding the first input signal using an iterative process, the iterative process includes a plurality of iterations, the decoding device includes
        a fetch component obtaining the first input signal from the input buffer, the fetch component configured to provide the first input signal to the decoding core and the data error calculator at the same time,
        a decoder core receiving the first input signal from the fetch component and decoding the first input signal, the decoding core configured to determine that the iterative process is complete based on an nth iteration and wherein a last two consecutive iterations of the plurality of iterations have the same result, and
        an output buffer for receiving the decoded first input signal; and
    a re-encoder configured to re-code the decoded first input signal received from the output buffer;

a data error calculator configured to receive the first input signal and the re-encoded first input signal and calculate a transport channel bit error rate (BER) of the first input signal during the decoding of the first input signal by the core decoder, wherein the data error calculator calculates the BER based on an nth−1 iteration, such that the calculation of the BER is simultaneous with the decoding of the first input signal.

2. The decoder according to claim 1, wherein the decoding device is configured to determine that the iterative process is complete based on the nth and nth−1 iterations.

3. The decoder according to claim 2, further comprising a comparator configured for comparing data bits of the first input signal after each iteration and determining when the data bits of the nth and nth−1 iterations are the same.

4. The decoder according to claim 2, wherein each iteration of the plurality of iterations is divided into half-iterations having a first and second decode processing phase, the data error calculator configured to calculate the BER during the first decode processing phase of each half-iteration.

5. The decoder according to claim 1, wherein the decoder is a turbo decoder.

6. The decoder according to claim 1, wherein the data error calculator comprises delay components for synchronizing the calculation of the BER of the first input signal received from the fetch component.

7. The decoder according to claim 1, wherein the data error calculator calculates the BER during each iteration of the iterative process.

8. A method of determining a transport channel bit error rate (BER), the method comprising:

receiving a first input signal by a decoding device;

decoding the first input signal by an iterative process, the iterative process includes a plurality of iterations, and determining that the iterative process is complete based on an nth iteration and wherein a last two consecutive iterations of the plurality of iterations have the same result; and re-encoding the decoded first input signal; and receiving, by a data error calculator at the same time as the decoding device, the first input signal and the re-encoded first input signal and calculating the BER for the first input signal during the decoding process, wherein the step of calculating includes calculating the BER based on an nth−1 iteration, such that the calculating of the BER is simultaneous with the decode process.

9. The method according to claim 8, wherein the step of determining comprises determining that the iterative process is complete based on the nth and nth−1 iterations.

10. The method according to claim 9 further comprising comparing data bits of the first input signal after each iteration and determining when the data bits of the nth and nth−1 iterations are the same.

11. The method according to claim 8, wherein each iteration of the plurality of iterations is divided into half-iterations having a first and second decode processing phase, and the step of calculating comprises calculating the BER during at least one forward processing phase of each half-iteration.

12. The method according to claim 8, wherein the data calculating step calculates the BER during each iteration of the iterative process.

* * * * *